(12) United States Patent
Guo

(10) Patent No.: US 8,369,709 B2
(45) Date of Patent: Feb. 5, 2013

(54) OPTICAL TRANSCEIVER AND PACKAGING METHOD THEREOF

(75) Inventor: Xiao-Ya Guo, Zhongshan (CN)

(73) Assignees: Ambit Microsystems (Zhongshan) Ltd., Zhongshan (CN); Hon Hai Precision Industry Co., Ltd., New Taipei (TW)

( * ) Notice: Subject to any disclaimer, the term of this patent is extended or adjusted under 35 U.S.C. 154(b) by 339 days.

(21) Appl. No.: 12/915,024

(22) Filed: Oct. 29, 2010

(65) Prior Publication Data

US 2012/0045216 A1 Feb. 23, 2012

(30) Foreign Application Priority Data

Aug. 20, 2010 (CN) .......................... 2010 1 0258938

(51) Int. Cl.
*H04B 10/00* (2006.01)
(52) U.S. Cl. ........................ 398/138; 398/135; 385/92
(58) Field of Classification Search .......... 398/135–139; 385/88–94
See application file for complete search history.

(56) References Cited

U.S. PATENT DOCUMENTS

| | | | | |
|---|---|---|---|---|
| 5,850,276 A * | 12/1998 | Ochi et al. | ..................... | 349/158 |
| 6,243,508 B1 * | 6/2001 | Jewell et al. | ..................... | 385/14 |
| 6,937,824 B2 * | 8/2005 | Watanabe | ..................... | 398/135 |
| 7,058,309 B1 * | 6/2006 | Eisenberger et al. | ......... | 398/135 |
| 7,160,035 B2 * | 1/2007 | Miyamae et al. | ................ | 385/88 |
| 7,177,548 B2 * | 2/2007 | Kuroda et al. | ................. | 398/135 |
| 7,203,426 B2 * | 4/2007 | Wu et al. | ........................ | 398/135 |
| 7,263,294 B2 * | 8/2007 | Horio | ............................ | 398/128 |
| 7,281,860 B2 * | 10/2007 | Fujita | ............................. | 385/88 |
| 7,309,174 B2 * | 12/2007 | Farr | ................................ | 385/94 |
| 7,500,792 B2 * | 3/2009 | Supper | ........................... | 385/90 |
| 7,606,499 B2 * | 10/2009 | Pan et al. | ....................... | 398/164 |
| 7,645,076 B2 * | 1/2010 | Martini et al. | ................... | 385/88 |
| 7,831,151 B2 * | 11/2010 | Trezza | ........................... | 398/135 |
| 7,907,847 B2 * | 3/2011 | Tanushi et al. | ................. | 398/139 |
| 8,175,461 B2 * | 5/2012 | Sone et al. | ..................... | 398/135 |
| 8,265,432 B2 * | 9/2012 | Doany et al. | ..................... | 385/14 |
| 8,265,486 B2 * | 9/2012 | Lim et al. | ....................... | 398/135 |
| 2002/0080323 A1 * | 6/2002 | Muroya | ........................... | 349/187 |
| 2003/0207493 A1 * | 11/2003 | Trezza et al. | .................. | 438/107 |
| 2003/0228759 A1 * | 12/2003 | Uehara et al. | .................. | 438/689 |
| 2005/0013562 A1 * | 1/2005 | Tatehata et al. | ................. | 385/93 |
| 2005/0084268 A1 * | 4/2005 | Weigert | ......................... | 398/135 |
| 2005/0185900 A1 * | 8/2005 | Farr | ................................ | 385/93 |
| 2006/0280504 A1 * | 12/2006 | Wang | ............................. | 398/138 |
| 2007/0297710 A1 * | 12/2007 | Suzuki | ............................. | 385/8 |
| 2008/0013959 A1 * | 1/2008 | Ishigami | ....................... | 398/135 |
| 2009/0202251 A1 * | 8/2009 | Shibayama | .................... | 398/138 |
| 2010/0247043 A1 * | 9/2010 | Sugawara et al. | ............... | 385/93 |
| 2011/0064418 A1 * | 3/2011 | Wang et al. | .................... | 398/139 |
| 2011/0150494 A1 * | 6/2011 | Guo | ................................ | 398/135 |
| 2012/0045216 A1 * | 2/2012 | Guo | ................................ | 398/135 |

* cited by examiner

*Primary Examiner* — Agustin Bello
(74) *Attorney, Agent, or Firm* — Altis Law Group, Inc.

(57) ABSTRACT

An optical transceiver includes a substrate, a plurality of laser components, a bracket and a plurality of lenses. The substrate defines a plurality of through holes, a plurality of receiving grooves and at least two fixing holes. The laser components are received in the plurality of receiving grooves and installed on the substrate. The bracket includes a top cover with an upper surface and one or more side walls. The one or more sidewalls include at least two positioning posts and one or more fixing surfaces. The positioning posts are engaged with the fixing holes to position the bracket to the substrate. The fixing surfaces are affixed on the substrate by an adhesive. The one or more sidewalls define one or more through channels extending from the one or more fixing surface to the upper surface. The lenses are installed on the bracket and correspond to the laser components.

7 Claims, 4 Drawing Sheets

OPTICAL TRANSCEIVER AND PACKAGING METHOD THEREOF

BACKGROUND

1. Technical Field

The present disclosure generally relates to optical transceivers, and more particularly to a packaging method of an optical transceiver.

2. Description of Related Art

Optical communications has become increasingly popular and is widely used in information transmission. Generally, optical transceivers are used in optical communication devices to perform a conversion between electrical signals and optical signals. An optical transceiver comprises a plurality of laser components and a plurality of lenses. Definition of position between the laser components and the lenses affects performance of transmitting information of the optical transceiver. Therefore, how to make an exact definition of position between the laser components and the lenses is an important problem in study.

Therefore, a need exists in the industry to overcome the described limitations and reduce the size of the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
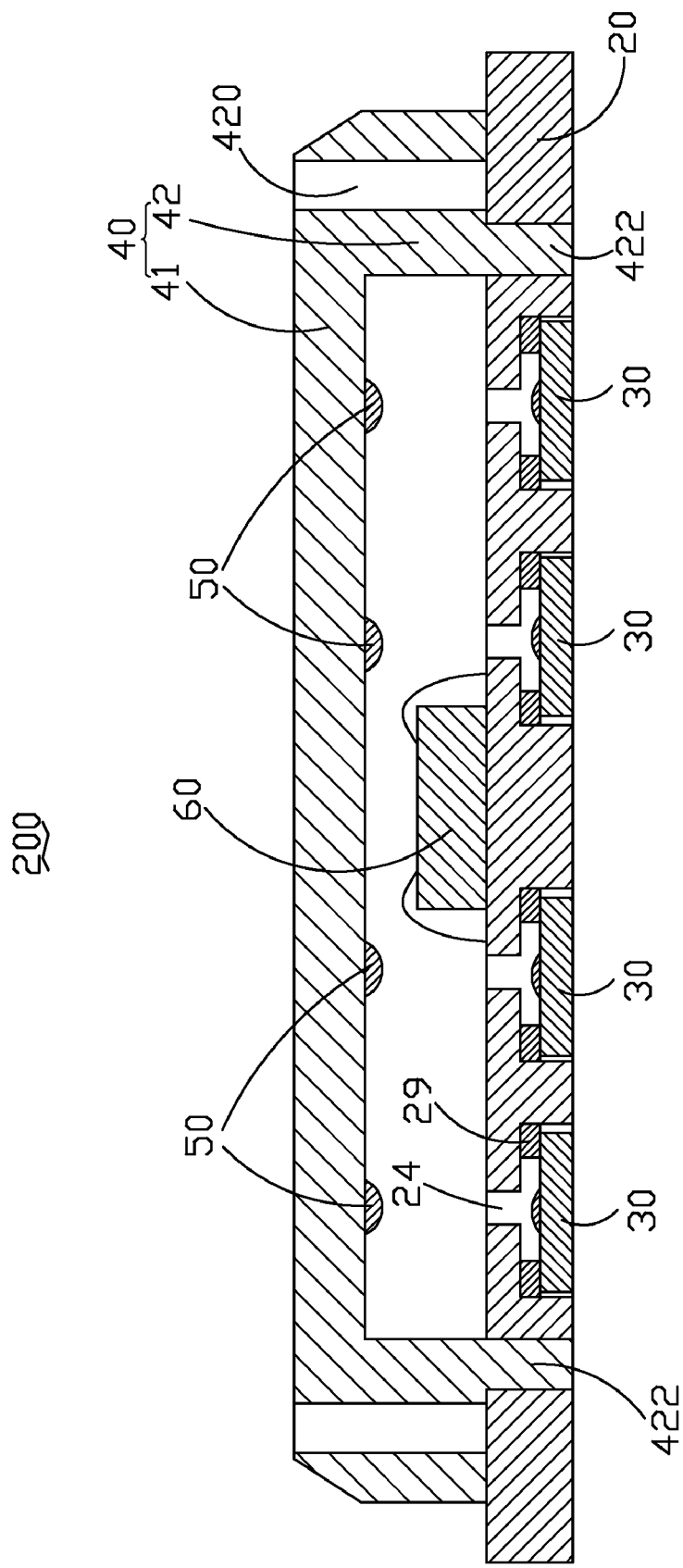
FIG. 1 is a schematic view of an optical transceiver of an exemplary embodiment of the disclosure.

FIG. 1 is a schematic view of an optical transceiver 200 of an exemplary embodiment of the disclosure. The optical transceiver 200 is used to perform a conversion between an electrical signal and an optical signal, and comprises a substrate 20, a plurality of laser components 30, a bracket 40, and a plurality of lenses 50.

Figure 2:
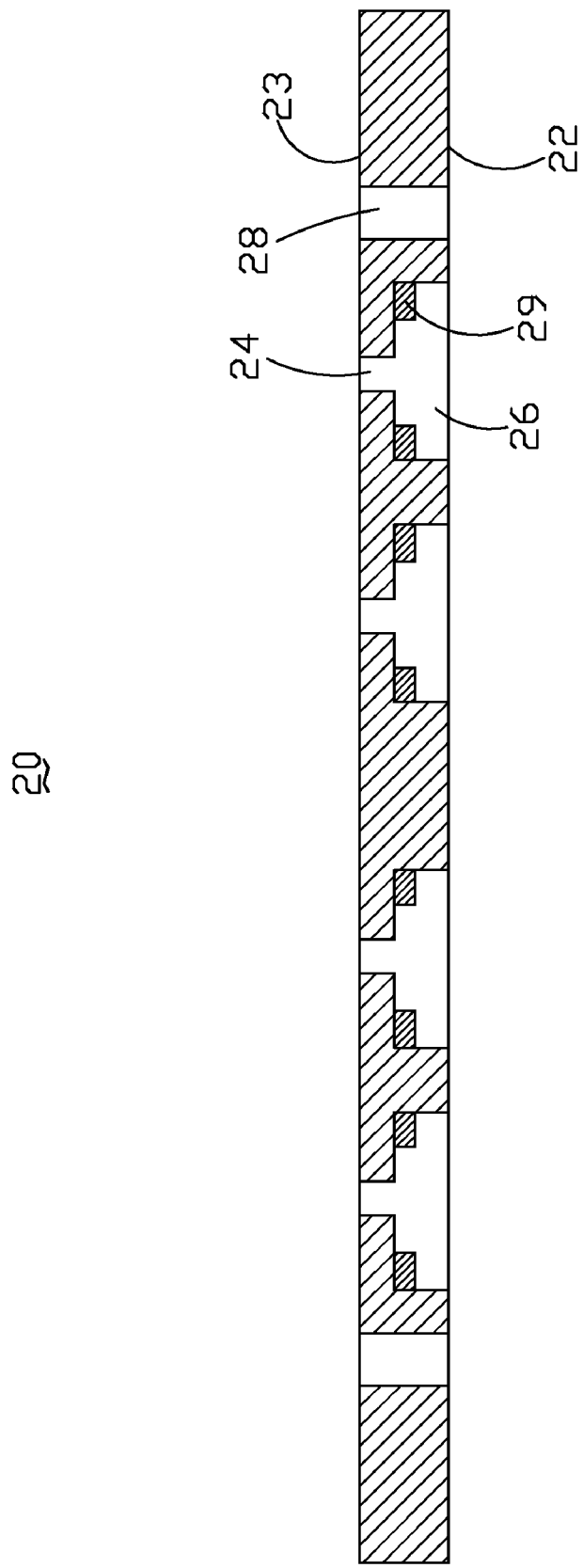
FIG. 2 is a schematic view of a substrate of the optical transceiver of FIG. 1.

Referring to FIG. 2, the substrate 20 comprises a top surface 23 and a bottom surface 22. The substrate 20 defines a plurality of through holes 24, a plurality of receiving grooves 26 and at least two fixing holes 28. Each of the plurality of through holes 24 is coaxial to and communicating with a corresponding one of the plurality of receiving grooves 26. The at least two fixing holes 28 are symmetrically opposite to each other and defined around the plurality of grooves 26. The plurality of receiving grooves 26 extend inwardly from the bottom surface 22. The plurality of through holes 24 extend from the plurality of receiving grooves 26 to the top surface 23, respectively.

Figure 3:
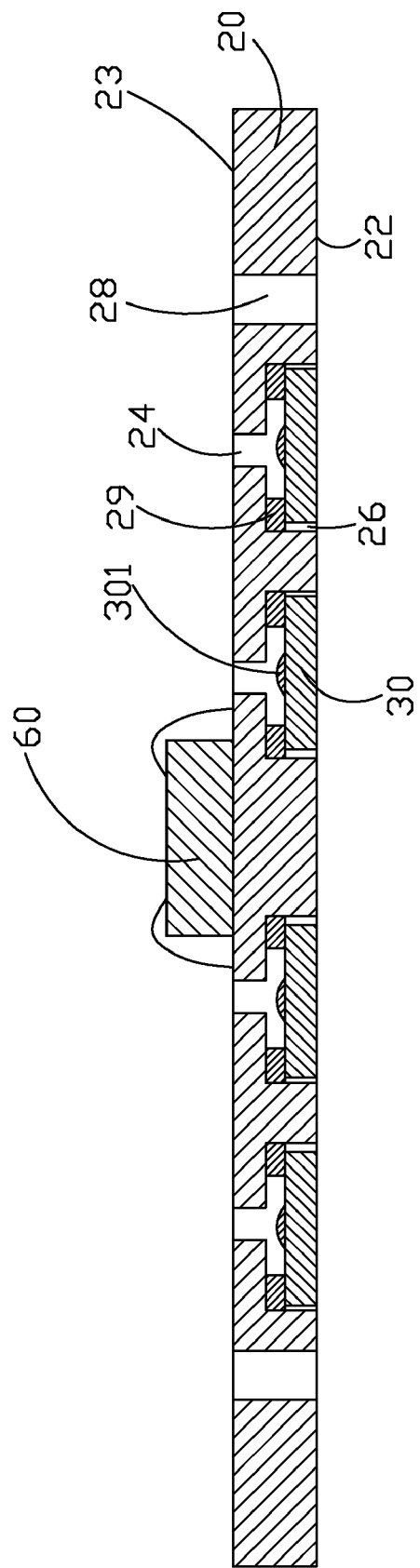
FIG. 3 is a schematic view of the substrate of FIG. 2, with a plurality of laser components and a driving chip installed.

Referring to FIG. 3, the plurality of laser components 30 are received in the plurality of receiving grooves 26 and installed on the substrate 20, respectively. In this embodiment, each of the laser components 30 comprises an optical element 301 opposite to a corresponding one of the through holes 24. The optical transceiver 200 further comprises a driving chip 60 installed on the top surface 23 of the substrate 20 to drive the plurality of laser components 30. Each of the laser components 30 is installed on the substrate 20 via a pair of soldering pads 29. The driving chip 60 is installed on the substrate via bonding-wires.

Figure 4:
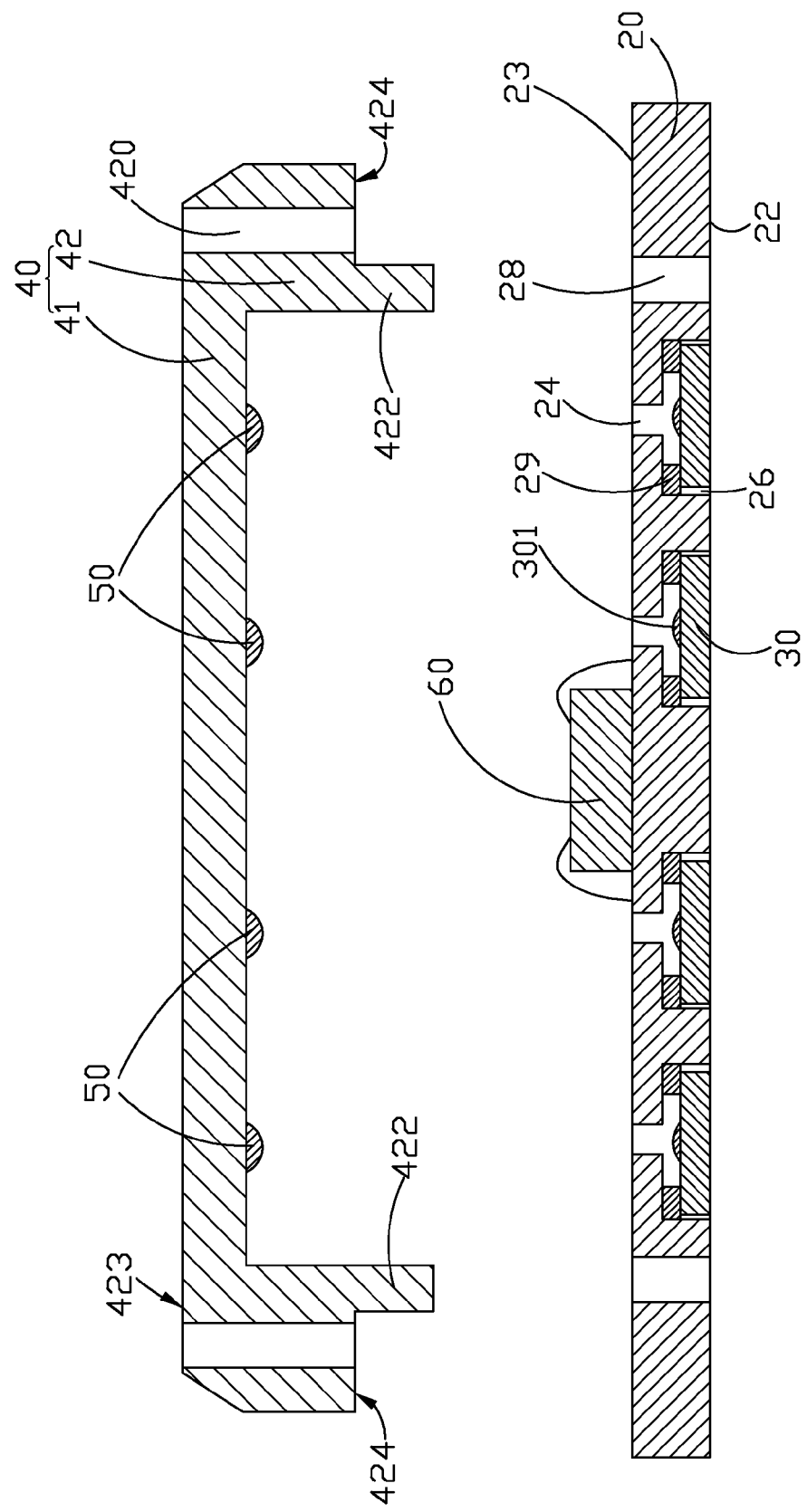
FIG. 4 is an exploded schematic view of the optical transceiver of FIG. 1, showing a bracket and the structure of FIG. 3.

Referring to FIG. 4, the bracket 40 comprises a top cover 41 with an upper surface 423 and one or more sidewalls 42 perpendicularly extending from the top cover 41 to the substrate 20. One or more fixing surfaces 424 are defined on the sidewalls 42 and in parallel to the upper surface 423. The fixing surfaces 424 are affixed on the substrate 20 by an adhesive, such as glue. One or more through channels 420 perpendicularly extend from the one or more fixing surfaces 424 to the upper surface 423 to improve ventilation of the fixing surfaces 424 so that the adhesive fixes the bracket 40 on the substrate 20 efficiently. The one or more sidewalls 42 comprise at least two positioning posts 422 engaged with the at least two fixing holes 28 to position the bracket 40 to the substrate 20.

The one or more sidewalls 42 define one or more through channels 420 extending from the fixing surfaces 424 to the upper surface 423 to improve a communication between the fixing surface 424 and the upper surface 423 to cure the adhesive and securely fix the bracket 40 on the substrate 20. In this embodiment, the glue can be an ultraviolet (UV) photoresist adhesive. The one or more through channels 420 are perpendicular to the substrate 20. Air from outer space can flow to the fixing surfaces 424 through the through channels 420 fleetly to cure the adhesive, thereby preventing excursion between the bracket 40 and the substrate 20 during manufacture process.

In assembly, the positioning posts 422 are snugly inserted into the fixing holes 28 to secure the bracket 40 on the substrate 20. In use, if the fixing surfaces 424 are apart from the substrate 20 due to distortion of the substrate 20, the bracket 40 is still fixed on the substrate 20 due to the engagement between the fixing posts 422 and the fixing holes 28.

The plurality of lenses 50 are installed on the top cover 41 of the bracket 40 and correspond to the plurality of optical elements 301 of the laser components 30.

A method of making the optical transceiver 200 comprises steps as follow.

Step 1: Providing the substrate 20. The substrate 20 comprises a top surface 23 and a bottom surface 22. The substrate 20 defines a plurality of through holes 24, a plurality of receiving grooves 26 and at least two fixing holes 28. Each of the plurality of through holes 24 is coaxial to and communicating with a corresponding one of the plurality of receiving grooves 26. The at least two fixing holes 28 are symmetrically opposite to each other and defined around the plurality of grooves 26. The plurality of receiving grooves 26 extend inwardly from the bottom surface 22. The plurality of through holes 24 extend from the plurality of receiving grooves 26 to the top surface 23, respectively.

Step 2: Installing the plurality of laser components 30 in the receiving grooves 26 of the substrate 30 via a welding or soldering process.

Step 3: Fabricating the bracket 40. The bracket 40 comprises a top cover 41 with an upper surface 423 and one or more sidewalls 42 perpendicularly extending from the top cover 41 to the substrate 20. One or more fixing surfaces 424 are defined on the sidewalls 42 and in parallel to the upper surface 423. One or more through channels 420 perpendicularly extend from the one or more fixing surfaces 424 to the upper surface 423. The one or more sidewalls 42 comprise at least two positioning posts 422.

Step 4: Installing the plurality of lenses 50 on the top cover 41 of the bracket 40. The lenses 50 correspond to the plurality of optical elements 301 of the laser components 30.

Step 5: Coating glue on the fixing surface 424 of the bracket 40. The glue can be an ultraviolet (UV) photo-resist adhesive in one example.

Step 6: Installing the bracket 40 to the substrate 20 via the at least two positioning posts 422 engaging with the at least two fixing holes 28 and the fixing surface 424 affixed on the substrate 20.

Step 7: Heating the substrate 20 installed with the bracket 40 via a thermal curing process.

In this embodiment, the method of making the optical transceiver 200 further comprises a step of installing the driving chip 60 on the substrate 20 after installing the plurality of laser components 30. The driving chip 60 is used to drive the plurality of laser components 30.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An optical transceiver, comprising:
    a substrate, defining a plurality of through holes, a plurality of receiving grooves and at least two fixing holes, each of the plurality of through holes coaxial to and communicating with a corresponding one of the plurality of receiving grooves, the at least two fixing holes located around the plurality of receiving grooves;
    a plurality of laser components, received in the plurality of receiving grooves, respectively;
    a bracket, comprising a top cover with an upper surface and one or more sidewalls perpendicularly extending from the top cover to the substrate, one or more fixing surfaces defined on the sidewalls and in parallel to the upper surface, the fixing surfaces being affixed on the substrate by an adhesive, one or more through channels perpendicularly extending from the one or more fixing surface to the upper surface to improve ventilation of the fixing surface so that the adhesive fixes the bracket on the substrate, wherein the one or more sidewalls comprise at least two positioning posts engaged with the at least two fixing holes to position the bracket to the substrate; and
    a plurality of lenses, installed on the top cover of the bracket and right corresponding to the plurality of laser components.

2. The optical transceiver as claimed in claim 1, further comprising a driving chip installed on the substrate to drive the plurality of laser components.

3. The optical transceiver as claimed in claim 2, wherein the substrate comprises a top surface, on which the driving chip installed, and a bottom surface, the plurality of receiving grooves extend inwardly from the bottom surface, the plurality of through holes extend from the plurality of receiving grooves to the top surface, respectively.

4. The optical transceiver as claimed in claim 3, wherein each of the laser components comprises an optical element opposite to a corresponding one of the through holes.

5. The optical transceiver as claimed in claim 4, wherein the one or more through channels are perpendicular to the substrate.

6. A method of making an optical transceiver, comprising:
    providing a substrate, the substrate defining a plurality of through holes, a plurality of receiving grooves and at least two fixing holes, each of the plurality of through holes coaxial to and communicating with a corresponding one of the plurality of receiving grooves, the at least two fixing holes located around the plurality of receiving grooves;
    installing a plurality of laser components in the receiving grooves of the substrate;
    fabricating a bracket, the bracket comprising a top cover with an upper surface and one or more sidewalls perpendicularly extending from the top cover to the substrate, one or more fixing surfaces defined on the sidewalls and in parallel to the upper surface, one or more through channels perpendicularly extending from the one or more fixing surface to the upper surface, wherein the one or more sidewalls comprise at least two positioning posts;
    installing a plurality of lenses on the top cover of the bracket, the plurality of lenses right corresponding to the plurality of laser components on the substrate;
    coating an adhesive on the fixing surface of the bracket; and
    installing the bracket to the substrate via the at least two positioning posts engaging with the at least two fixing holes and the fixing surface affixed on the substrate, and heating the substrate via a thermal curing process.

7. The method of making an optical transceiver as claimed in claim 6, further comprising installing a driving chip on the substrate after installing the plurality of laser components on the substrate, the driving chip used to drive the plurality of laser components.

* * * * *